United States Patent
Okuyama et al.

(10) Patent No.: US 10,060,953 B2
(45) Date of Patent: Aug. 28, 2018

(54) CURRENT SENSOR

(71) Applicant: Hitachi Metals, Ltd., Tokyo (JP)

(72) Inventors: Ken Okuyama, Hitachi (JP); Naoki Futakuchi, Hitachinaka (JP); Katsuya Akimoto, Mito (JP); Yujiro Tomita, Hitachi (JP)

(73) Assignee: HITACHI METALS, LTD., Tokyo (JP)

( * ) Notice: Subject to any disclaimer, the term of this patent is extended or adjusted under 35 U.S.C. 154(b) by 0 days.

(21) Appl. No.: 15/471,134

(22) Filed: Mar. 28, 2017

(65) Prior Publication Data
US 2017/0285075 A1    Oct. 5, 2017

(30) Foreign Application Priority Data
Apr. 1, 2016  (JP) ................. 2016-074091

(51) Int. Cl.
*G01R 15/20*    (2006.01)
*G01R 33/09*    (2006.01)

(52) U.S. Cl.
CPC ......... *G01R 15/205* (2013.01); *G01R 33/093* (2013.01)

(58) Field of Classification Search
CPC ... G01R 1/14; G01R 5/00; G01R 5/14; G01R 9/02; G01R 9/04; G01R 11/10; G01R 11/21; G01R 23/02
See application file for complete search history.

(56) References Cited

U.S. PATENT DOCUMENTS

| | | | |
|---|---|---|---|
| 7,583,072 B2 | 9/2009 | Muraki et al. | |
| 9,513,317 B2 | 12/2016 | Okuyama et al. | |
| 2007/0090826 A1* | 4/2007 | Itoh | G01R 15/207 324/117 R |
| 2007/0200551 A1 | 8/2007 | Muraki et al. | |
| 2015/0204915 A1* | 7/2015 | Okuyama | G01R 19/0092 324/117 R |

FOREIGN PATENT DOCUMENTS

| JP | 4612554 B2 | 1/2011 |
|---|---|---|
| JP | 2015-137892 A | 7/2015 |

* cited by examiner

*Primary Examiner* — Tung X Nguyen
(74) *Attorney, Agent, or Firm* — McGinn IP Law Group, PLLC.

(57) ABSTRACT

A current sensor includes a busbar carrying an electric current to be measured, a magnetic sensing element for detecting intensity of a magnetic field generated by the current flowing through the busbar, and a pair of shield plates that include a magnetic material and are arranged to sandwich the busbar in a thickness direction of the busbar. The busbar includes a through-hole penetrating therethrough and current paths formed on both sides of the through-hole, the magnetic sensing element is arranged at a position overlapping the through-hole in the thickness direction of the busbar. The busbar is arranged in a space between the pair of shield plates such that the center in the thickness direction is located at a position offset from the center of the space in the thickness direction.

5 Claims, 3 Drawing Sheets

CURRENT SENSOR

The present application is based on Japanese patent application No. 2016-074091 filed on Apr. 1, 2016, the entire contents of which are incorporated herein by reference.

BACKGROUND OF THE INVENTION

1. Field of the Invention

The invention relates to a current sensor.

2. Description of the Related Art

Current sensors are known which are provided with a magnetic sensing element for detecting intensity of a magnetic field generated by an electric current to be measured (see e.g., JP-B-4612554 and JP-A-2015-137892). Magnetic field intensity is detected by the magnetic detection element, and the current is derived by calculation based on the magnetic field intensity.

SUMMARY OF THE INVENTION

It is desirable to use a magnetic sensing element having high sensitivity, e.g., a GMR (Giant Magneto Resistive effect) sensor etc. such that an electric current can be detected more accurately.

In general, the high-sensitivity magnetic sensing element such as a GMR sensor only can detect a narrow range of magnetic field intensity. Thus, in detecting a large current, e.g., a current flowing in each phase of a three-phase motor, a magnetic field generated by a measured electric current may be too large to use the high-sensitivity magnetic sensing element such as a GMR sensor.

It is an object of the invention to provide a current sensor that can detect a large current with high accuracy.

According to an embodiment of the invention, a current sensor comprises:

a busbar carrying an electric current to be measured, a magnetic sensing element for detecting intensity of a magnetic field generated by the current flowing through the busbar; and a pair of shield plates that comprise a magnetic material and are arranged to sandwich the busbar in a thickness direction of the busbar, wherein the busbar comprises a through-hole penetrating therethrough and current paths formed on both sides of the through-hole, the magnetic sensing element is arranged at a position overlapping the through-hole in the thickness direction of the busbar, and wherein the busbar is arranged in a space between the pair of shield plates such that the center in the thickness direction is located at a position offset from the center of the space in the thickness direction.

Effects of the Invention

According to an embodiment of the invention, a current sensor can be provided that can detect a large current with high accuracy.

BRIEF DESCRIPTION OF THE DRAWINGS

Next, the present invention will be explained in more detail in conjunction with appended drawings, wherein:

FIGS. 1A and 1B are diagrams illustrating a current sensor in an embodiment of the present invention, wherein FIG. 1A is a perspective view and FIG. 1B is a cross sectional view taken along a line A-A in FIG. 1A;

DETAILED DESCRIPTION OF THE PREFERRED EMBODIMENTS

Embodiment

An embodiment of the invention will be described below in conjunction with the appended drawings.

Figure 1A:
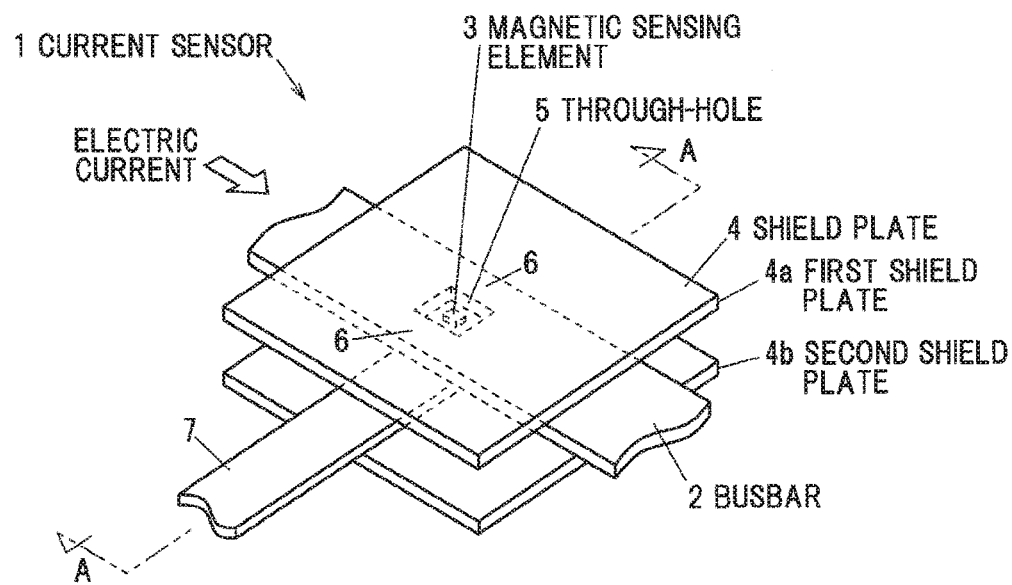
Figure 1B:
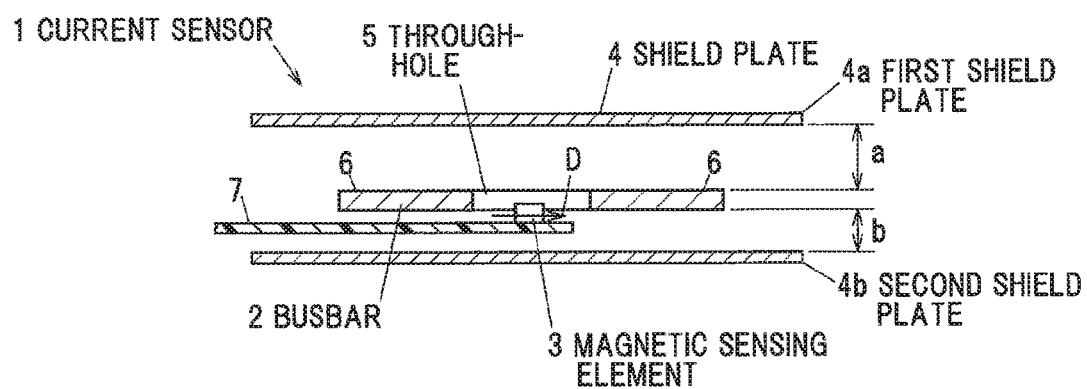

FIGS. 1A and 1B are diagrams illustrating a current sensor in the present embodiment, wherein FIG. 1A is a perspective view and FIG. 1B is a cross sectional view taken along a line A-A in FIG. 1A.

As shown in FIGS. 1A and 1B, a current sensor 1 is provided with a busbar 2 carrying an electric current to be measured, a magnetic sensing element 3 for detecting intensity of a magnetic field generated by the current flowing through the busbar 2, and a pair of shield plates 4 which are formed of a magnetic material and are arranged to sandwich the busbar 2 in a thickness direction of the busbar 2.

The busbar 2 is a plate-shaped conductor formed of a highly electrically conductive material such as copper or aluminum and serves as a current path for carrying a current. The busbar 2 is used as a power line between, e.g., a motor and an inverter in an electric car or hybrid car. The current flowing through the busbar 2 is, e.g., about 200 A in a steady state and up to about 800 A as inrush current in an abnormal state, etc., and has a frequency of, e.g., up to about 100 kHz. In the present embodiment, the current flows along a longitudinal direction of the busbar 2.

The magnetic sensing element 3 is configured to output a voltage output signal according to magnetic field intensity (magnetic flux density) in a direction along a detection axis D. In the present embodiment, a GMR sensor having a high sensitivity is used as the magnetic element 3.

The shield plates 4 are provided to shield an external magnetic field to prevent the external magnetic field from affecting the detection result of the magnetic sensing element 3. Each shield plate 4 is constructed from a plate-shaped member formed of, e.g., a magnetic material such as silicon steel, permalloy or ferrite.

The shield plates 4 are arranged at a distance from the busbar 2 so as to sandwich the busbar 2 in a thickness direction. In addition, the shield plates 4 are arranged such that the surfaces thereof are parallel to the surface of the busbar 2 (such that a normal direction of the shield plates 4 coincides with the thickness direction of the busbar 2).

In the present embodiment, a through-hole 5 is formed on the busbar 2. The through-hole 5 penetrates the busbar 2 and the busbar 2 is present around the circumference of the through-hole 5. In other words, the through-hole 5 does not have a notched shape with an opening on a side of the busbar 2. As a result of forming such through-hole 5, current paths 6 are formed on both sides of the through-hole 5.

In the present embodiment, the through-hole 5 is formed in the middle of the busbar 2 in a width direction. The current paths 6 formed on the both sides of the through-hole 5 have the same width.

Inside the through-hole 5, magnetic fields generated by the two current paths 6 cancel each other out. That is, as a result of forming the through-hole 5, magnetic field intensity is reduced inside the through-hole 5 or in the vicinity of the through-hole 5.

In the present embodiment, the magnetic sensing element 3 is arranged at a position overlapping the through-hole 5 in the thickness direction of the busbar 2. In other words, the magnetic sensing element 3 is arranged at a position overlapping the through-hole 5 when viewed in plan from one side of the thickness direction of the busbar 2. Here, the term "the magnetic sensing element 3 is arranged at a position overlapping the through-hole 5 in the thickness direction of the busbar 2" means that at least a portion of the magnetic sensing element 3 is located at a position overlapping the through-hole 5 when viewed in plan from above or below in FIG. 1B, and it includes, e.g., the case where only a portion of the magnetic sensing element 3 is located at a position overlapping the through-hole 5 when viewed in plan. Meanwhile, the magnetic sensing element 3 when viewed in the cross section of FIG. 1B may be located partially inside the through-hole 5 or entirely outside the through-hole 5 (above or below the through-hole 5). In the present embodiment, the magnetic sensing element 3 is arranged between the two shield plates 4 at a distance from the two shield plates 4.

By forming the through-hole 5 on the busbar 2 and arranging the magnetic sensing element 3 at a position overlapping the through-hole 5 in the thickness direction of the busbar 2, it is possible to reduce a magnetic field to be detected by the magnetic sensing element 3 even when a large current is flowing through the busbar 2.

The magnetic sensing element 3 is mounted on a substrate 7. The substrate 7 is inserted between the busbar 2 and the shield plate 4 such that the magnetic sensing element 3 is located at a position overlapping the through-hole 5 when viewed in plan. The substrate 7 is formed of a resin such as glass epoxy.

A GMR sensor used as the magnetic sensing element 3 has the detection axis D along the surface of the substrate 7. In the present embodiment, the magnetic sensing element 3 is arranged such that the detection axis D thereof extends along the width direction of the busbar 2. The magnetic sensing element 3 may alternatively be arranged such that the detection axis D extends along the thickness direction of the busbar 2. In this case, however, it is necessary to bend a front end portion of the substrate 7 at 90° and then to mount the magnetic sensing element 3 on the bent portion, which makes the structure of the current sensor 1 complicated.

A molding resin is filled between the two shield plates 4 such that the two shield plates 4, the magnetic sensing element 3, the busbar 2 and the substrate 7 are integrated, even though it is not illustrated. The molding resin prevents detection errors due to vibration, etc., by stabilizing the positions of the magnetic sensing element 3, the busbar 2 and the two shield plates 4, and also prevents detection errors due to penetration of foreign object between the shield plates 4.

In the current sensor 1 of the present embodiment, the busbar 2 is arranged in a space between the pair of shield plates 4 such that its center in the thickness direction is located at a position offset from the center of the space in the thickness direction.

In other words, the current sensor 1 is configured that a distance a between the busbar 2 and one of shield plates 4 along the thickness direction is different from a distance b between the busbar 2 and the other shield plate 4 along the thickness direction. Hereinafter, one of the shield plates 4 is referred to as a first shield plate 4a and the other shield plate 4 is referred to as a second shield plate 4b. The distance a between first shield plate 4a and the busbar 2 is larger than the distance b between the second shield plate 4b and the busbar 2. That is, the second shield plate 4b is arranged closer to the busbar 2 than the first shield plate 4a.

A difference between the distances a and b from the busbar 2 to the two shield plates 4 can be appropriately set according to, e.g., the magnitude of the current flowing through the busbar 2 and/or the position of the magnetic sensing element 3 but is desirably not less than 10% of the distance between the two shield plates 4 (for example, when the distance between the two shield plates 4 is 10 mm, the difference between the distances a and b is not less than 1 mm).

Figure 2A:
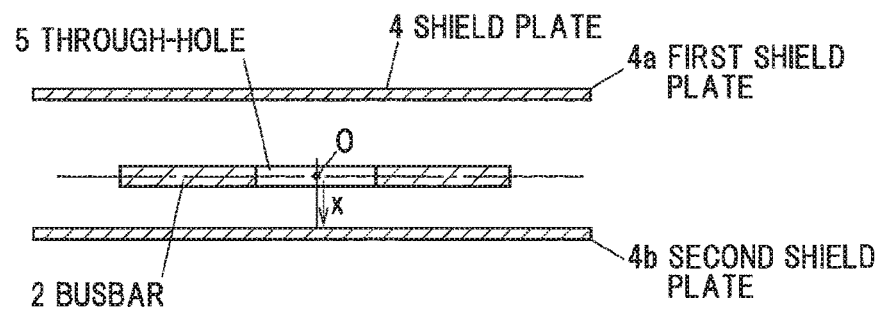
FIG. 2A is an explanatory diagram illustrating a position x from the center of a busbar.
Figure 2B:
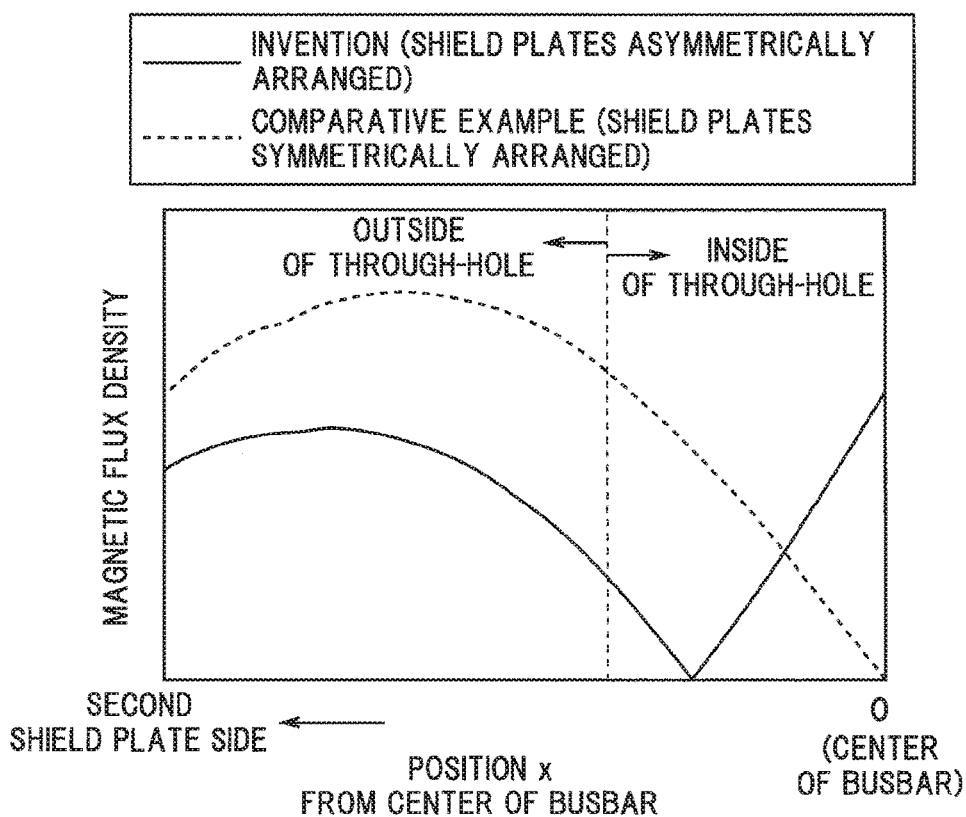
FIG. 2B is a graph showing a relation between the position x from the center of the busbar and magnetic flux density.

In FIG. 2A, the center of the through-hole 5 of the busbar 2 (the center in the width, length and thickness directions, hereinafter referred to as "busbar center") is indicated by o, and a distance from the busbar center o toward the second shield plate 4b (the position from the busbar center) along the thickness direction is indicated by x. FIG. 2B shows a relation between the distance x (the position from the busbar center) and magnetic field intensity (magnetic flux density) detected at the position (distance) x when the current flowing through the busbar 2 is constant.

As indicated by a solid line in FIG. 2B, in the present embodiment in which the shield plates 4 are arranged asymmetrically (the distances a and b from the busbar 2 to the two shield plates 4 are different, a>b), the detected magnetic flux density is zero at a position offset from the center (the busbar center) o of the through-hole 5 toward the second shield plate 4b and gradually becomes larger as closer to the second shield plate 4b.

In Contrast, in Comparative Examples in which the shield plates 4 are arranged symmetrically (the distances a and b from the busbar 2 to the two shield plates 4 are equal), the detected magnetic flux density is zero at the center (the busbar center) o of the through-hole 5 and gradually becomes larger as closer to the second shield plate 4b, as indicated by a dashed line in FIG. 2B.

As understood from the comparison between the solid line and the dashed line in FIG. 2B, since the distances a and b from the busbar 2 to the two shield plates 4 are different in the present embodiment, magnetic field intensity in the vicinity of the busbar 2 (inside the through-hole 5 and in the vicinity of the through-hole 5) is reduced as compared to Comparative Example in which the shield plates 4 are arranged symmetrically.

Since magnetic field intensity detected at the position offset from the center o of the through-hole 5 toward the first shield plate 4a is larger in the present embodiment than in Comparative Example even though it is not shown in FIG. 2B, the magnetic sensing element 3 is preferably arranged on the second shield plate 4b side relative to the center of the busbar 2 in the thickness direction (at a position offset toward the shield plate 4 which is located closer to the busbar 2). In the present embodiment, the substrate 7 mounting the magnetic sensing element 3 is inserted between the busbar 2 and the second shield plate 4b.

Taking into account the magnetic field intensity range detectable by the magnetic sensing element 3 and the magnitude of the current flowing through the busbar 2, the magnetic sensing element 3 is arranged at a position where magnetic field intensity to be detected is an appropriate level. The position of the magnetic sensing element 3 does not need to be the center in the length and width directions of the through-hole 5, as long as the magnetic sensing element 3 is arranged at a position overlapping the through-hole 5 when viewed in plan.

In the present embodiment, intensity of the magnetic field to be detected by the magnetic sensing element 3 is attenuated by formation of the through-hole 5 in combination with the difference between the distances a and b from the busbar 2 to the two shield plates 4, and this allows the magnetic sensing element 3 such as GMR sensor to detect a current highly accurately even when a large current is flowing through the busbar 2. In other words, in the present embodiment, the shield plates 4 serve to shield an external magnetic field and also serve to attenuate the intensity of the magnetic field to be detected by the magnetic sensing element 3.

Although the current flowing through one busbar 2 is detected in the present embodiment, the invention is applicable to detect currents flowing through plural busbars 2.

Figure 3:
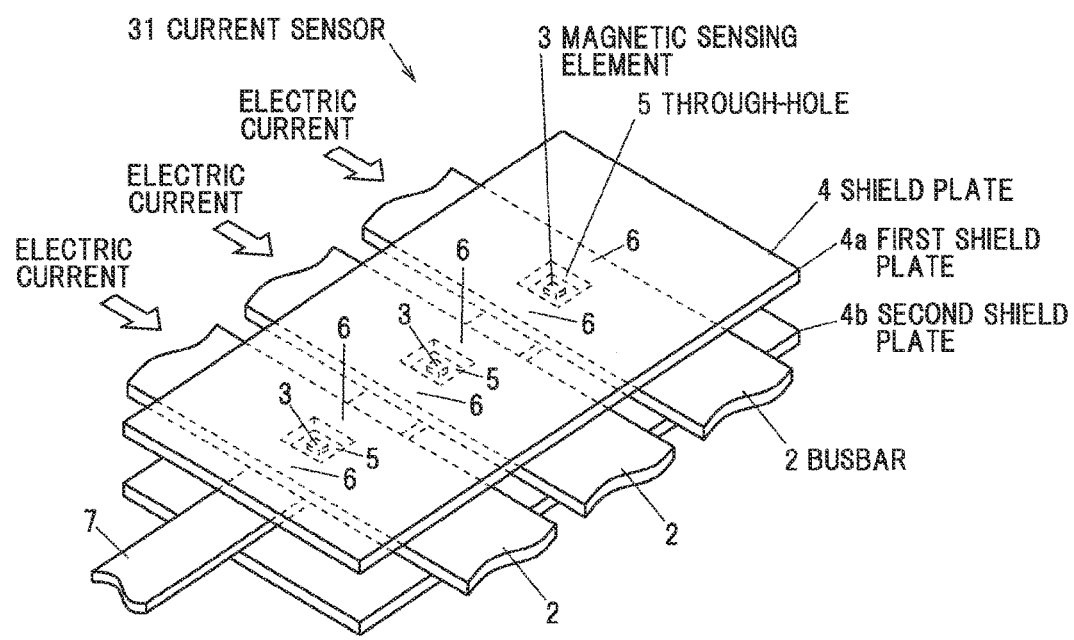
FIG. 3 is a perspective view showing a current sensor in a modification of the invention.

For example, in case of detecting currents flowing through three busbars 2 as in a current sensor 31 shown in FIG. 3, the busbars 2 are aligned in the same plane and are all sandwiched between the two shield plates 4. In this case, the busbars 2 are located closer to the second shield plate 4b than to the first shield plate 4a. The magnetic sensing elements 3 corresponding to the respective busbars 2 are arranged at positions overlapping the through-holes 5 as well as offset from the centers of the busbars 2 toward the second shield plate 4b in the thickness direction. By aligning the through-holes 5 of the busbars 2 in the width direction, plural (three in this example) magnetic sensing elements 3 corresponding to the respective busbars 2 can be mounted on one substrate 7 and it is thus possible to detect currents flowing through plural busbars 2 by a simple structure. The currents flowing through the busbars 2 may be, e.g., three-phase AC flowing between a motor and an inverter.

Functions and Effects of the Embodiment

As described above, the current sensor 1 in the present embodiment is configured such that the busbar 2 has the through-hole 5 penetrating therethrough and the current paths 6 formed on the both sides of the through-hole 5, the magnetic sensing element 3 is arranged at a position overlapping the through-hole 5 in the thickness direction of the busbar 2, and the busbar 2 is arranged in a space between the pair of shield plates 4 such that its center in the thickness direction is located at a position offset from the center of the space in the thickness direction.

The magnetic field intensity to be detected by the magnetic sensing element 3 can be reduced by forming the through-hole 5 and also arranging the magnetic sensing element 3 at a position overlapping the through-hole 5 in the thickness direction of the busbar 2. However, since the magnetic sensing element 3 is designed to be mounted on the substrate 7, the magnetic sensing element 3 may practically be arranged at a distance from the center of the through-hole 5 (the center in the thickness direction), causing that the magnetic field intensity to be detected by the magnetic sensing element 3 is not sufficiently reduced and it is difficult to measure a large current.

For this reason, in the present embodiment, it is also configured such that the busbar 2 is arranged at a position offset from the center between the two shield plates 4 such that the distances a and b from the busbar 2 to the two shield plates 4 are different, thereby further reducing the magnetic field intensity to be detected by the magnetic sensing element 3. As a result, it is possible to use a GMR sensor as the magnetic sensing element 3 even when the electric current to be measured is a large current such as a current flowing between, e.g., a motor and an inverter, and the current thus can be detected with high accuracy. In other words, in the present embodiment, it is possible to realize the current sensor 1 which can detect a large current with high accuracy.

Summary of the Embodiments

Technical ideas understood from the embodiment will be described below citing the reference numerals, etc., used for the embodiment. However, each reference numeral, etc., described below is not intended to limit the constituent elements in the claims to the members, etc., specifically described in the embodiment.

[1] current sensor (1), comprising: a busbar (2) carrying an electric current to be measured, a magnetic sensing element (3) for detecting intensity of a magnetic field generated by the current flowing through the busbar (2); and a pair of shield plates (4) that comprise a magnetic material and are arranged to sandwich the busbar (2) in a thickness direction of the busbar (2), wherein the busbar (2) comprises a through-hole (5) penetrating therethrough and current paths (6) formed on both sides of the through-hole (5), the magnetic sensing element (3) is arranged at a position overlapping the through-hole (5) in the thickness direction of the busbar (2), and the busbar (2) is arranged in a space between the pair of shield plates (4) such that the center in the thickness direction is located at a position offset from the center of the space in the thickness direction.

[2] The current sensor (1) described in the [a], wherein the pair of shield plates (4) comprise a first shield plate (4a) and a second shield plate (4b) arranged closer to the busbar (2) than the first shield plate (4a), and the magnetic sensing element (3) is arranged at a position offset from the center of the busbar (2) toward the second shield plate (4b) in the thickness direction.

[3] The current sensor (1) described in the [1] or [2], wherein the magnetic sensing element (3) comprises a GMR sensor.

[4] The current sensor (1) described in the [3], wherein the magnetic sensing element (3) is arranged such that the detection axis (D) thereof extends along a width direction of the busbar (2).

[5] The current sensor (31) described in any of the [1] to [4], comprising: a plurality of busbars (2); and a plurality of magnetic sensing elements (3) corresponding to the plurality of busbars (2), wherein the plurality of busbars (2) are aligned in the same plane, and the pair of shield plates (4) are arranged such that all of the plurality of busbars (2) are sandwiched therebetween.

Although the embodiment of the invention has been described, the invention according to claims is not to be limited to the embodiment described above. Further, please note that all combinations of the features described in the embodiment are not necessary to solve the problem of the invention.

The invention can be appropriately modified and implemented without departing from the gist thereof.

For example, although a GMR sensor is used as the magnetic sensing element 3 in the embodiment, it is not limited thereto. Another element such as AMR (Anisotropic MagnetoResistive) sensor, TMR (Tunneling MagnetoResistive) sensor or Hall IC can be used as the magnetic sensing element 3. In this regard, to realize high accuracy current detection, it is desirable to use the magnetic sensing element 3 with as high accuracy as possible.

In addition, although one magnetic sensing element 3 is used in the embodiment, it is not limited thereto. Plural (e.g., two) magnetic sensing elements 3 may be arranged at positions overlapping the through-hole 5 when viewed in plan such that an electric current is detected based on outputs from the plural magnetic sensing elements 3.

Furthermore, the through-hole 5 in the embodiment is formed on the busbar 2 at the center in the width direction, the through-hole 5 may be formed on the busbar 2 at a position offset from the center in the width direction. In other words, the current paths 6 on the both sides of the through-hole 5 may have different widths.

What is claimed is:

1. A current sensor, comprising:
    a busbar carrying an electric current to be measured,
    a magnetic sensing element for detecting intensity of a magnetic field generated by the current flowing through the busbar; and
    a pair of shield plates that comprise a magnetic material and are arranged to sandwich the busbar in a thickness direction of the busbar,
    wherein the busbar comprises a through-hole penetrating therethrough and current paths formed on both sides of the through-hole, the magnetic sensing element is arranged at a position overlapping the through-hole in the thickness direction of the busbar, and
    wherein the busbar is arranged in a space between the pair of shield plates such that the center in the thickness direction is located at a position offset from the center of the space in the thickness direction.

2. The current sensor according to claim 1, wherein the pair of shield plates comprise a first shield plate and a second shield plate arranged closer to the busbar than the first shield plate, and the magnetic sensing element is arranged at a position offset from the center of the busbar toward the second shield plate in the thickness direction.

3. The current sensor according to claim 1, wherein the magnetic sensing element comprises a GMR sensor.

4. The current sensor according to claim 3, wherein the magnetic sensing element is arranged such that the detection axis thereof extends along a width direction of the busbar.

5. The current sensor according to claim 1, comprising:
    a plurality of busbars; and
    a plurality of magnetic sensing elements corresponding to the plurality of busbars,
    wherein the plurality of busbars are aligned in the same plane, and the pair of shield plates are arranged such that all of the plurality of busbars are sandwiched therebetween.

* * * * *